United States Patent
Uomori et al.

(10) Patent No.: US 6,832,646 B1
(45) Date of Patent: Dec. 21, 2004

(54) COOLER FOR ELECTRONIC DEVICE

(75) Inventors: Yasuharu Uomori, Kiyose (JP);
Masanori Takahashi, Kiyose (JP);
Satoshi Ito, Kiyose (JP)

(73) Assignee: Nippon Thermostat Co., Ltd., Tokyo (JP)

( * ) Notice: Subject to any disclaimer, the term of this patent is extended or adjusted under 35 U.S.C. 154(b) by 0 days.

(21) Appl. No.: 09/889,577

(22) PCT Filed: Feb. 26, 1999

(86) PCT No.: PCT/JP99/00940

§ 371 (c)(1),
(2), (4) Date: Nov. 8, 2001

(87) PCT Pub. No.: WO00/52401

PCT Pub. Date: Sep. 8, 2000

(51) Int. Cl.[7] ................................................ H05K 7/20
(52) U.S. Cl. ...................... 165/80.2; 361/690; 361/698; 361/694; 165/80.3
(58) Field of Search .............................. 165/80.2, 80.3, 165/80.4, 80.5, 185; 257/712, 714, 722; 361/688, 689, 690, 698, 694

(56) References Cited

U.S. PATENT DOCUMENTS

| | | | | |
|---|---|---|---|---|
| 5,203,401 A | * | 4/1993 | Hamburgen et al. ... | 165/80.4 X |
| 5,211,493 A | * | 5/1993 | Stephenson et al. ... | 165/80.4 X |
| 5,220,809 A | * | 6/1993 | Voss ...................... | 165/80.4 X |
| 5,271,455 A | * | 12/1993 | Semple ...................... | 165/80.4 |
| 5,285,347 A | * | 2/1994 | Fox et al. .............. | 165/80.4 X |
| 5,349,831 A | * | 9/1994 | Daikoku et al. ....... | 165/80.4 X |
| 5,471,850 A | * | 12/1995 | Cowans ................. | 165/80.4 X |
| 5,901,037 A | * | 5/1999 | Hamilton et al. ...... | 165/80.4 X |
| 6,175,495 B1 | * | 1/2001 | Batchelder | |
| 6,377,453 B1 | * | 4/2002 | Belady | |
| 6,507,492 B2 | * | 1/2003 | Morris et al. ............... | 361/698 |

* cited by examiner

*Primary Examiner*—Ljiljana Ciric
(74) *Attorney, Agent, or Firm*—Westerman, Hattori, Daniels & Adrian, LLP

(57) ABSTRACT

This is a cooler for dissipating heat away from an electronic device (A). The cooler includes a liquid cooling mechanism (B), a forcible air cooling mechanism (C) and a substrate (D). The liquid cooling mechanism includes a set of metal pipes (20–21) connected to a pump (3) with an impeller (16) to transfer cooling liquid to a liquid channel (4). The forcible air cooling mechanism (C) includes a fan (25) discharging air onto a radiating fin (37) located on the set of metal pipes (20–21). The substrates (D) is in fluid communication with the forcible air cooling mechanism (C) and the liquid cooling mechanism (B) and in direct contact with the electronic device (A) so as to remove heat away from the electronic device (A).

11 Claims, 7 Drawing Sheets

COOLER FOR ELECTRONIC DEVICE

FIELD OF THE INVENTION

The present invention relates to a cooler for an electronic device, for example, a cooler for an electronic device, which is suitable for cooling a CPU, or the like contained in a thin type electronic device such as a notebook personal computer.

BACKGROUND OF THE INVENTION

Since heating parts are accommodated within an electronic device, it has hitherto been carried out to radiate the heat of the heating parts out of the electronic device so that the heat from the heating parts do not have any adverse influence upon any other electronic parts. In the conventional electronic device, for example, a radiating fin is provided on the upper surface of the heating part to carry out self-cooling via the radiating fin.

However, in a cooler having such a type of a radiating fin as being provided on the upper surface of the heating part in order to carry out self-cooling, the cooler becomes taller due to the radiating fin provided on the upper surface of the heating part and, thus, the cooler is not suitable for a thin type electronic device like a notebook personal computer.

For this reason, in a recent thin type electronic device such as a notebook personal computer, the heat has been radiated out by transferring the heat generated from the heating parts to the body of the device or the keyboard through a heat pipe. In such a type of cooler, when the heat is radiated outwardly, forcible air-cooling by means of a small size fan or the like is carried out in order to enhance the effect for heat-radiation.

However, although the cooler described above using the heat pipe satisfies the requirement for producing a thin type electronic device, the effect of heat-radiation is limited due to the use of the heat pipe, making the cooler unsuitable for an electronic device accommodating an electronic part which generates a large amount of heat such as a CPU having an increasingly improved performance.

As a cooler which has solved such problem and which has an enhanced effect of heat-radiation, a cooler has been suggested in Japanese Patent Laid-Open No.7-142886, in which a cooling liquid is circulated within the heating element to allow the heating element to be forcibly cooled. Such type of conventional cooler will now be described by referring to FIG. 7.

As shown in FIG. 7, a heating element c such as a semiconductor element is provided on the surface of a wiring substrate which is stored in a body made of metal, this body being in the form of a casing of the electronic device. A cooler for the heating element c is composed of a heat-receiving header d provided on the upper surface of the heating element c, a radiating header e secured on a metal casing g in the form of a case lid and a pair of flexible tubes f communicating with the inside of the heat receiving header d and the inside of the radiating header e.

Furthermore, a liquid channel in which a liquid flows back and forth is formed within the heat-receiving header d. Both ends of the liquid channel are connected to the inside of the radiating header e via the two respective flexible tubes f. A liquid channel in which a liquid flows back and forth, a piston for circulating a cooling liquid within the liquid channel and a motor which drives the piston via a link mechanism are placed within the radiating header e.

In the cooler for an electronic device thus constructed, the heat generated from the heating element is transmitted to the heat-receiving header d, and the heat received by the heat-receiving header d is then transmitted to the cooling liquid which flows within the heat-receiving header d.

Almost all of the heat transmitted to the cooling liquid is then transmitted out to the radiating header e from the inner wall of the liquid channel within the radiating header e, but the remaining part of the heat maintains the temperature of the cooling liquid.

The heat transmitted to the heat-radiation header d is mainly emitted to the atmosphere via the metal body g, but if there is heat which is not emitted, the temperature of the heat-radiation header e is kept high.

Technical problems for the cooler for an electronic device described above also remain as described herein below:

(1) There is a technical problem that due to the increases in the much higher processing speed and performance of the CPU and due to the modularization of the components and the onboard new units associated with multimedia accompanying the progress in the CPU, power consumption is rapidly increased to in turn increase the amount of the heat generated from the heating elements contained in the electronic device, so that the heat transmitted to the cooing liquid cannot be sufficiently radiated out through the radiating header. Furthermore, since the circulation of the cooling liquid is carried out by means of the piston, the circulation of the cooling liquid becomes discontinuous, making it impossible to sufficiently radiate out the heat.

(2) Since the heat-receiving header and the radiating header are connected by means of the flexible tubes, there is a risk of damaging the electronic device itself when the flexible tubes are damaged, causing the cooling liquid to leak. What is worse, there is a technical problem with regard to many more man-hours being required for mounting, since in the cooler described above, after the heat-receiving header and the radiating header have been mounted, the flexible tubes must be placed on the wiring substrate.

(3) Moreover, the parts composing the cooler is separately distributed therewithin, making it difficult to cut down on the space in a notebook personal computer or the like. This prevents the notebook personal computer or the like from being downsized and made thinner.

As described above, no cooler has yet been provided which fulfills the following requirements for a smaller size or thinner type of electronic device like a notebook personal computer, i.e., the cooler must be smaller and thinner, the cooler must have an effective and sufficient effect for heat-radiation, and the cooler can safely be used in such an electronic device.

SUMMARY OF THE INVENTION

The present invention has been made to solve the technical problems described above, and an object of the present invention is to provide a cooler for an electronic device which is smaller and thinner than the conventional cooler, which can show a sufficient cooling effect with higher effectiveness, and which has no risk of being damaged.

A cooler for an electronic device according to the present invention, which has been made to attain the object described above is a cooler for an electronic device which cools a heating element provided on the electronic device, which comprises: a liquid cooling mechanism composed of a heat sink which is formed in a flat shape, having a heat-receiving face at one surface thereof intended to be in contact with said electronic device, and having a liquid channel accommodated therein, a pump portion comprising a housing which is formed into a flat shape and which has an impeller, which can be rotated, provided therein, and metal pipes, each of which connects said liquid channel to said pump portion; and a forcible air cooling mechanism, composed of a radiating fin provided on the outer surface of said metal pipes, and a fan which cools said radiating fin and said housing, said liquid cooling mechanism and said forcible air cooling mechanism being unified with each other.

Due to such a construction, since the heat sink is formed into a flat shape, the heat-receiving face can be enlarged and, thus, the heat generated in the electronic device is transmitted to the liquid channel via the heat-receiving face having such an enlarged area, making it possible to maintain the temperature of the electronic an device within the tolerance level. On the other hand, since the cooling liquid heated due to the heat exchange is forcibly cooled by means of the forcible air cooling mechanism, the cooler can maintain a large cooling effect, even if the electronic device is used over a prolonged period of time. The higher the cooling effect of the cooler, the easier the downsizing of the cooler becomes.

Since the pipe portion and the liquid channel of the heat sink are connected by means of the metal pipes, there is no risk of leakage of damaging the electronic device itself. What is more, the cooler of the present invention is unified into a whole unit and is made into a fixed form by connecting the pump portion and the heat sink by means of the metal pipes. Consequently, in contrast to the conventional cooler, it is not required to place flexible tubes on the wiring substrate, so it becomes easy to mount the cooler. Moreover, the pump can be continuously driven, making it possible to continuously and effectively cool the cooling liquid.

It is desirable for the cooler of the present invention to arrange the impeller and the fan therewihin such that the axis of the rotation of the impeller forming the forcible air cooling mechanism are positioned on an identical line. In the case where the impeller and the fan are arranged such that the axis of the rotation of the impeller forming the liquid cooling mechanism and the axis of the rotation of the fan forming the forcible air cooling mechanism are positioned on an identical line, the forcible air cooling mechanism can be placed in the vicinity of the pump portion, and this makes it possible to improve the cooing efficiency.

It is also desirable for the fan and the impeller to be rotated at the same time together. More specifically, the fan and the impeller are adapted to rotate together by providing said fan with a magnet for rotating the fan which rotates under the influence of the magnetic fluctuation of a motor substrate and another magnet for driving the impeller while providing said impeller with a passive magnet which receives the magnetic force from said magnet for driving the impeller. It may also be possible to design such that the fan and the impeller are rotated together by providing said fan with a magnet for rotating the fan which rotates under the influence of the magnetic fluctuation of a motor substrate while providing the impeller with a passive magnet to receive the magnetic force from said magnet for rotating the fan.

Thus constructed, the mechanism for driving the fan and the mechanism for driving the impeller can be simplified and, thus, it becomes possible to miniaturize the forcible air cooling mechanism and the pump portion.

Particularly, in the case where the fan is provided with a magnet for rotating the fan which rotates under the influence of the magnetic fluctuation of the motor substrate and a passive magnet which receives the magnetic force from said magnet for rotating the fan, the constructions of the mechanism for driving the fan and of the mechanism for driving the impeller can be simplified much more than the constructions described above.

Desirably, the motor substrate is made of an insulating plate having a coil formed on the surface thereof, the fan is in the form of a thin plate having a plurality of bent blades at the periphery of a thin plate member having a rotation axis at the middle portion thereof while the motor substrate, the fan, and the flat pump portion are laminated on each other.

This construction has a merit in that the pump portion and the forcible air cooling mechanism has a compact and integrated structure.

Furthermore, it is desirable that the metal pipes each connecting the pump portion to the liquid channel of the heat sink are folded at least once at a position between the pump portion and the heat sink, and a radiating fin is placed on the folded portion.

Where the radiating fin is placed on the folded portion, the radiating fin can be tightly fixed onto the portion between the metal pipes and, at the same time, the area in contact with the metal pipes can be enlarged, making it possible to improve the cooling efficiency of the metal pipes.

Furthermore, the radiating fin and the portions of the metal pipes on which the radiating fin is placed are desirably mounted in contact with the mounting plate having thereon a housing provided which forms the pump portion. When the radiating fin and the portions of the metal pipes on which the radiating fin is placed are mounted in contact with the mounting plate having thereon a housing provided thereon which forms the pump portion, the heat is also transmitted to the mounting plate, and it becomes possible to carry out the cooling through the mounting plate.

In the case where a port capable of causing air to pass therethrough is formed on at least one portion of the mounting plate which is positioned on the radiating fin, the air passes by the radiating fin to forcibly cool the radiating fin, which makes it possible to improve the cooling efficiency.

It is desirable from the viewpoints of heat conductivity and prevention of corrosion that the heat sink is made of aluminum which is a highly heat-conductive material, and that the metal pipe is made of copper.

BRIEF DESCRIPTION OF THE DREAWINGS

BEST MODE FOR CARRYING OUT THE INVENTION

Figure 1:
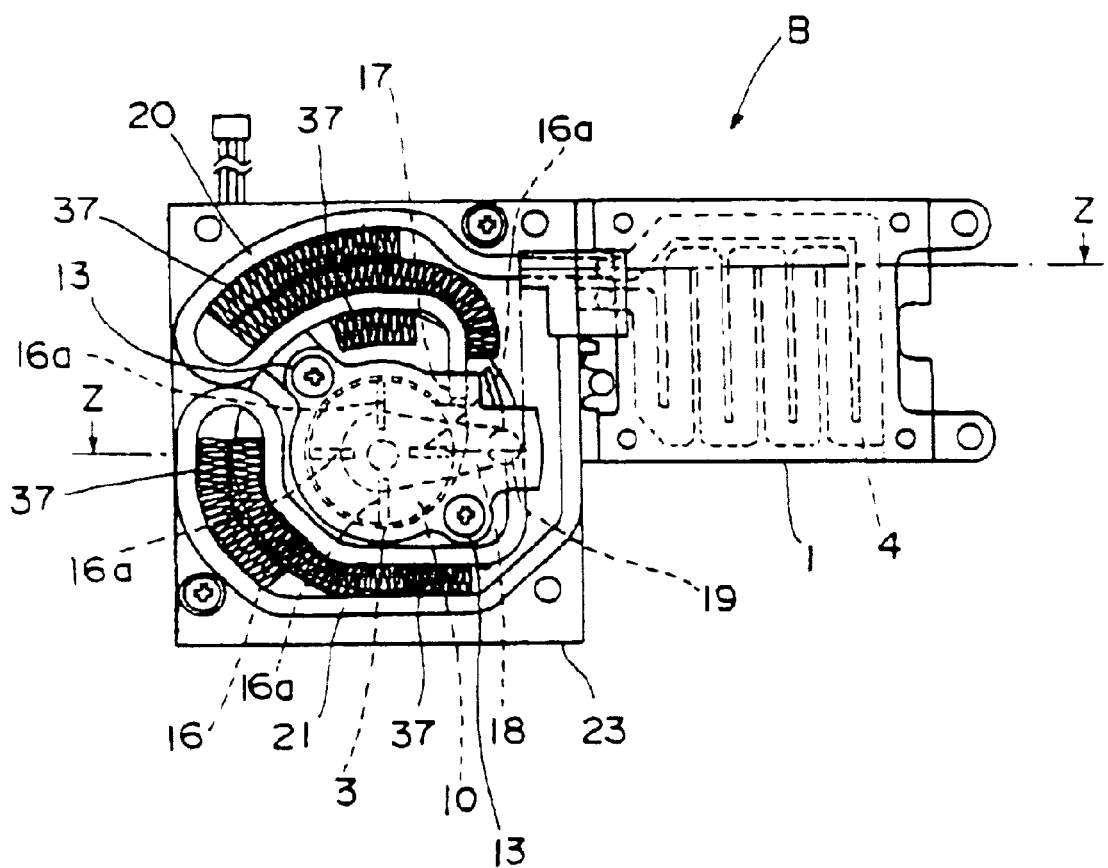
FIG. 1 is a bottom view which illustrates a cooler for an electronic device according to one embodiment of the present invention.
Figure 2:
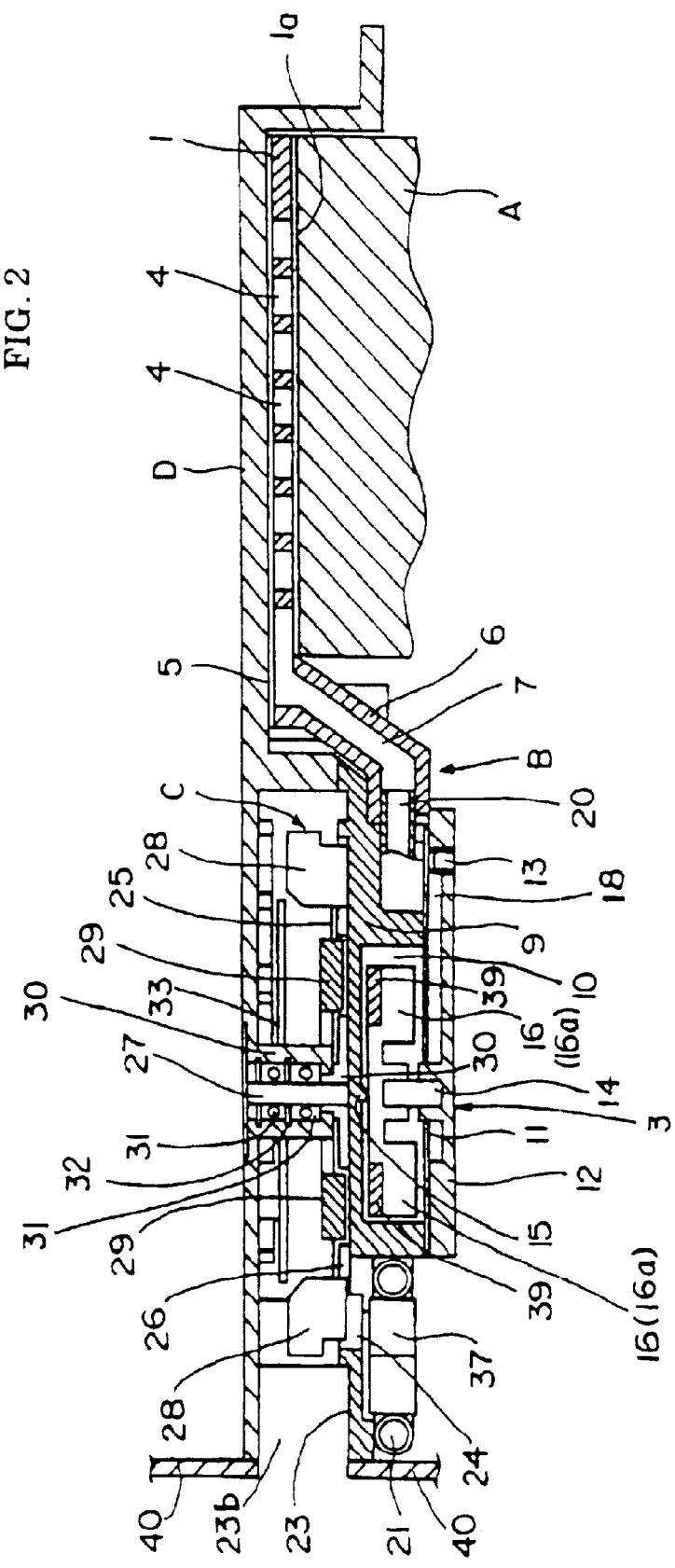
FIG. 2 is a cross-sectional view taken along the line Z—Z of a FIG. 1.
Figure 3:
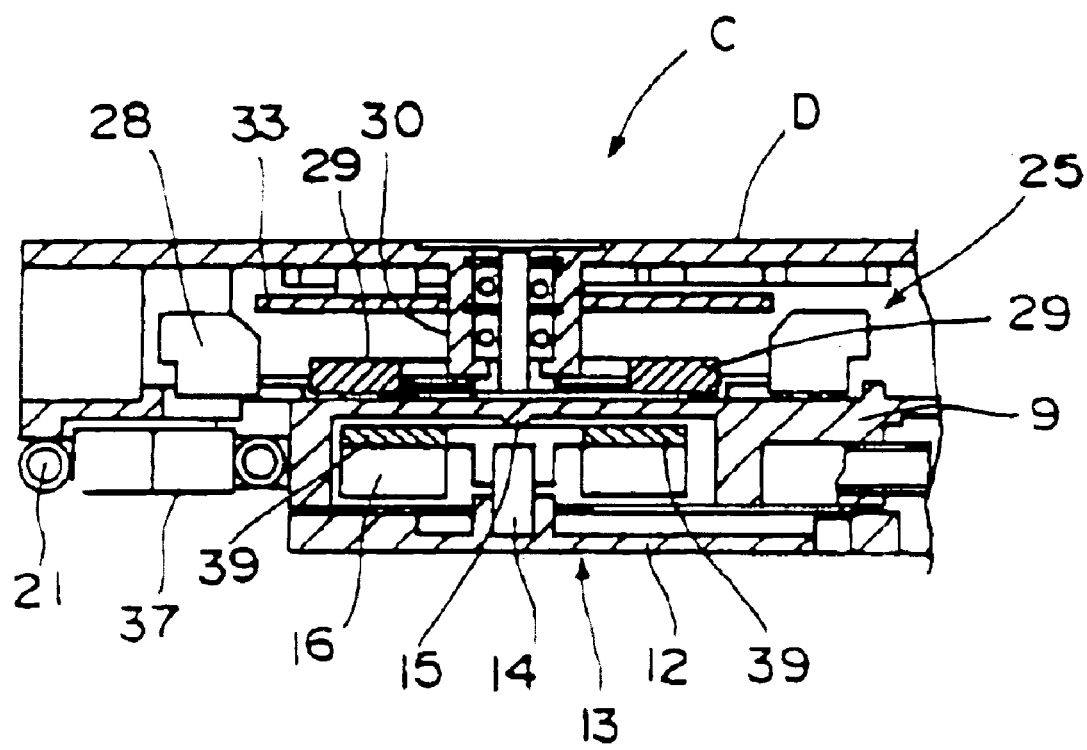
FIG. 3 is a cross-sectional view which illustrates the portions of the mechanisms for driving the fan and the pump of FIG. 2.
Figure 4:
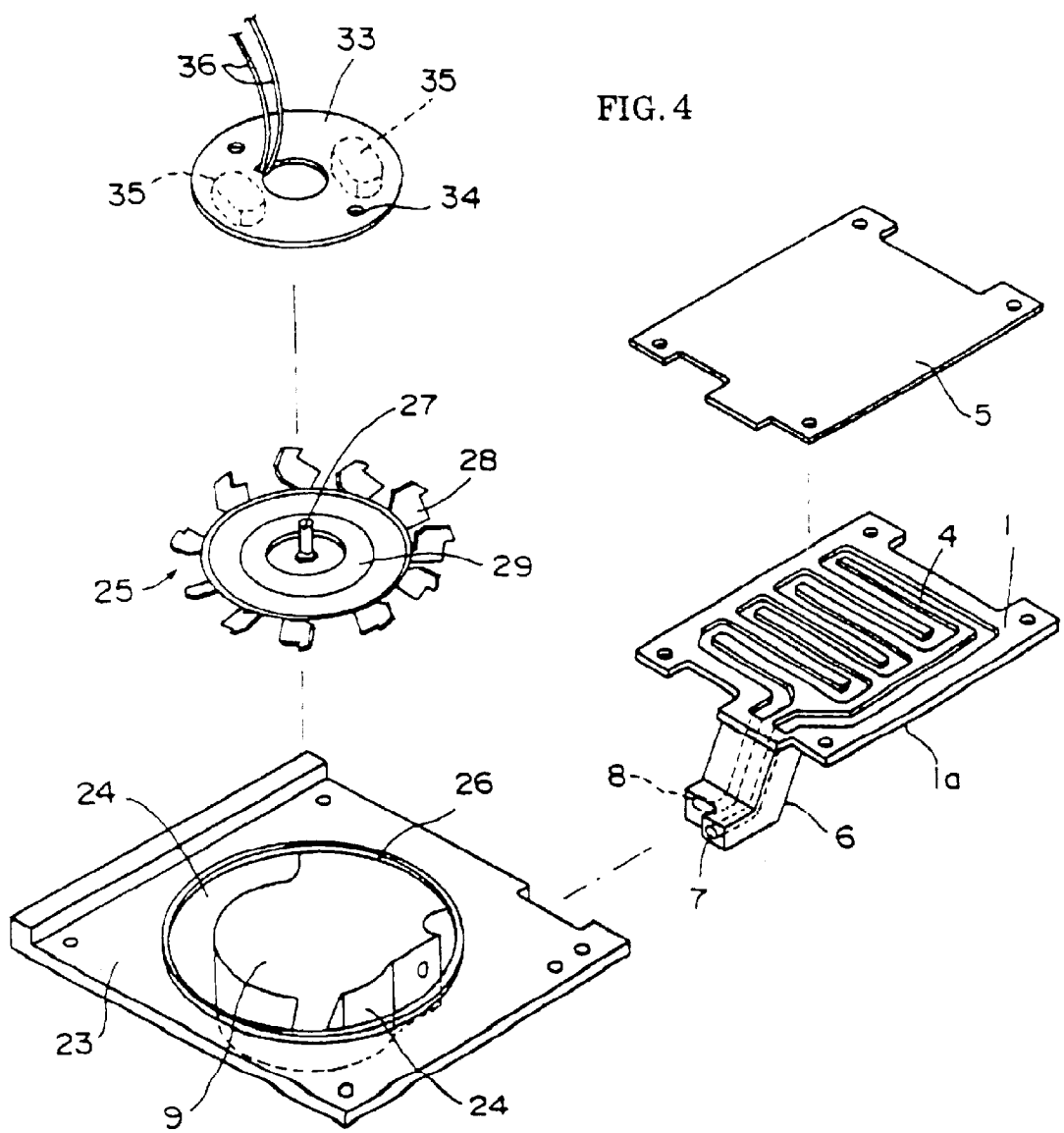
FIG. 4 is an exploded perspective view which illustrates the main portions of the embodiment shown in FIG. 1.
Figure 5:
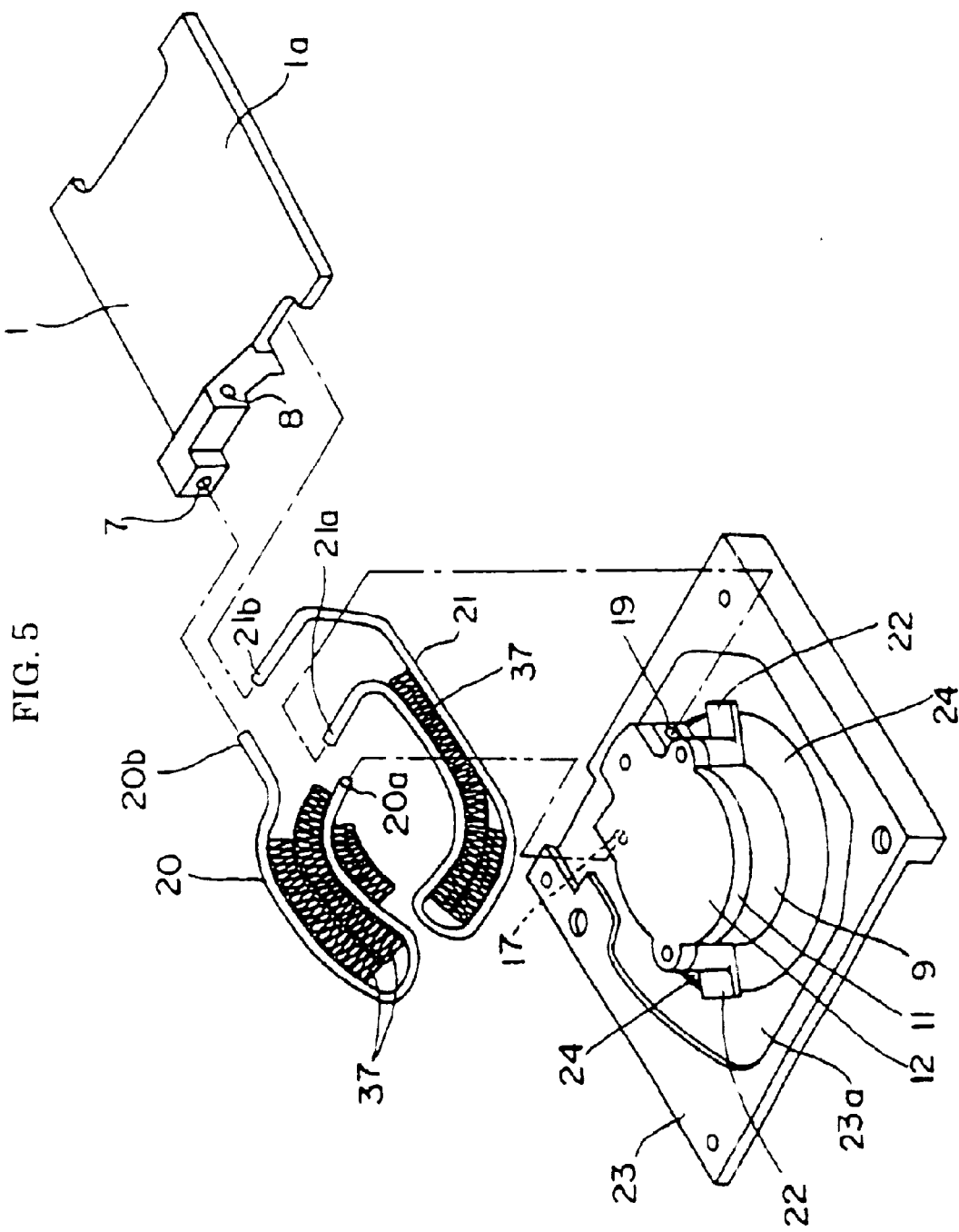
FIG. 5 is an exploded perspective view which illustrates the main portions (metal pipes and associated parts) of the embodiment shown in FIG.1.
Figure 6:
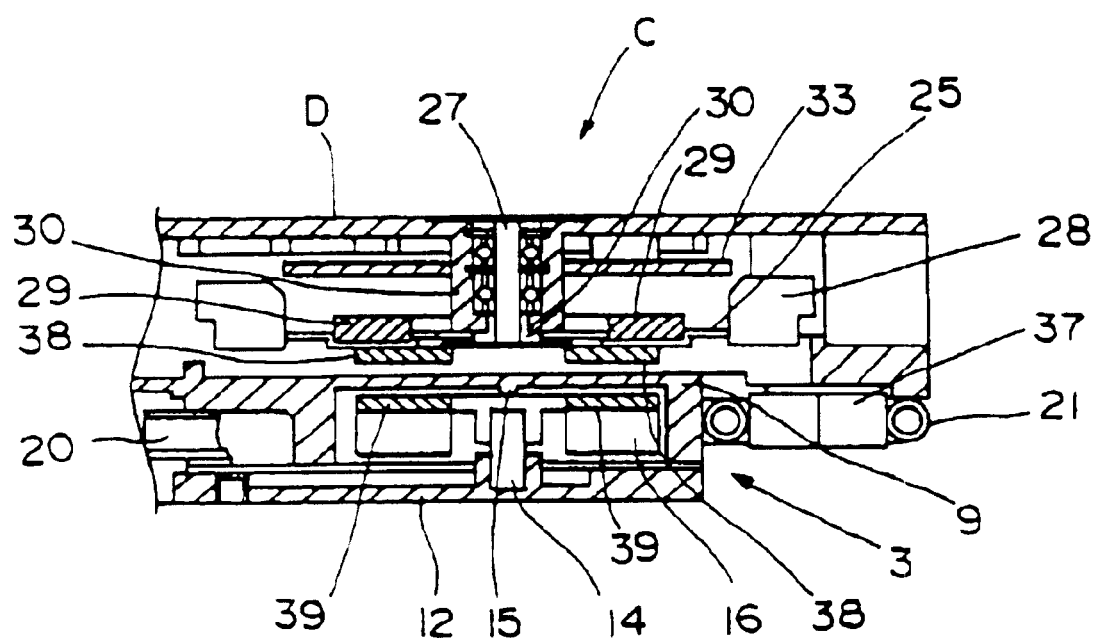
FIG. 6 is a cross-sectional view which illustrates the mechanisms for driving the fan and the pump according to the second embodiment of the present invention.
Figure 7:
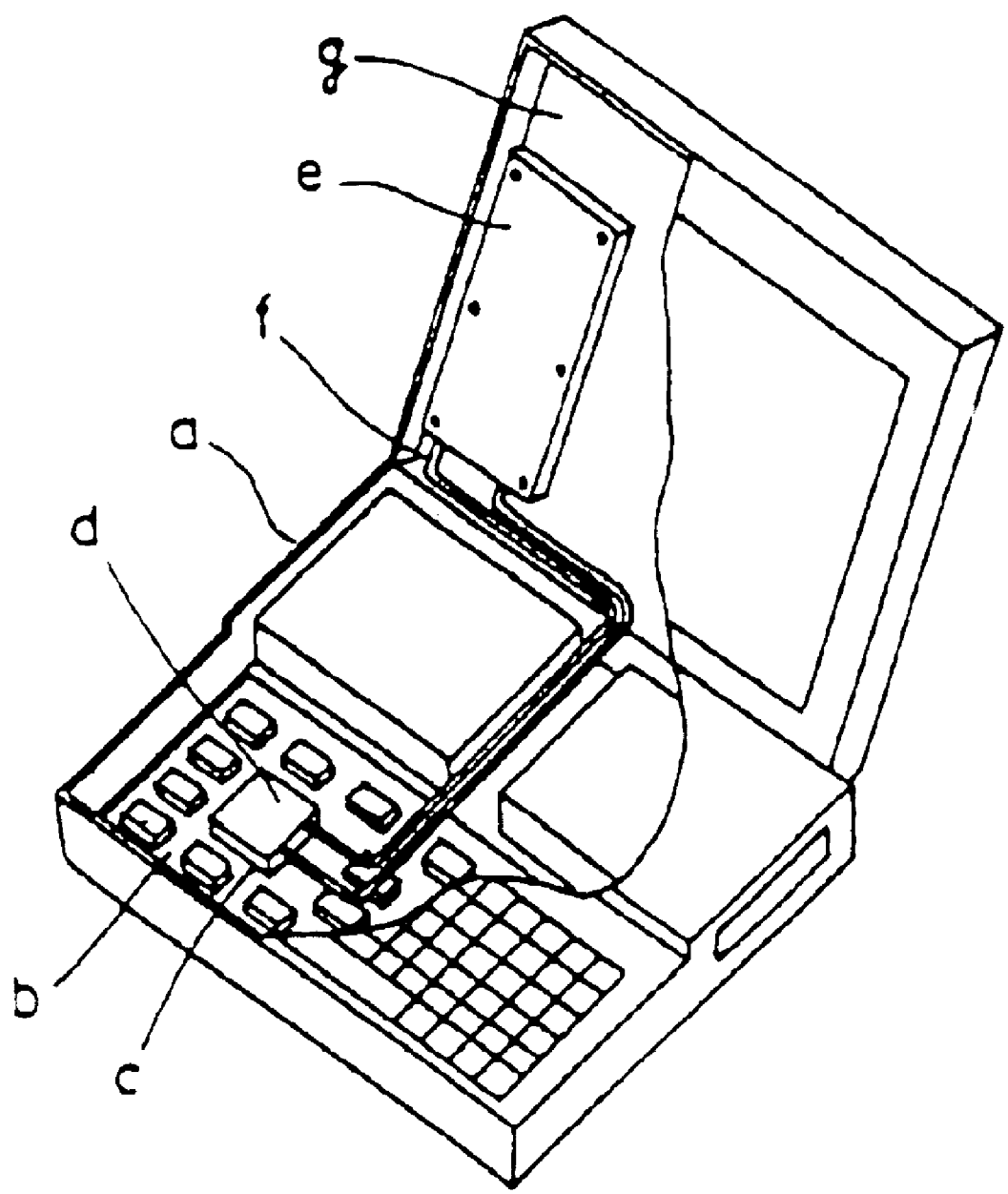
FIG. 7 is a perspective view which illustrates a cooler for an electronic device according to the prior art.

The embodiments of the present invention will now be described by referring to the drawings. FIGS. 1 to 6 are drawings of a cooler for an electronic device according to the present invention. FIG. 1 is a bottom view; FIG. 2 is a cross-sectional view of FIG. 1 taken along the line Z—Z; FIG. 3 is a cross-sectional view which illustrates the portions of the mechanisms for driving the fan and the pump of FIG. 2; FIG. 4 is an exploded perspective view which illustrates the main portions of the embodiment shown in FIG. 1; FIG. 5 is an exploded perspective view which illustrates the metal pipes and associated parts of the embodiment shown in FIG. 1; and FIG. 6 is a perspective view which illustrates the mechanisms for driving the fan and the pump according to the second embodiment of the present invention.

As shown in FIG. 2, in the cooler for an electronic device according to the present invention, a liquid cooling mechanism B, which absorbs the heat generated from the heating element A within the electronic device, is forcibly cooled by a forcible air cooling mechanism C. The liquid cooling mechanism B and the forcible air cooling mechanism C are constructed so as to be unified with each other as shown in FIG. 2.

Also, as shown in FIGS. 1 and 2, the liquid cooling mechanism B is composed of a heat sink 1, which comes into contact with the upper surface of the heating element A of the electronic device and a pump portion 3 connected to the heat sink 1 via metal pipes 20 and 21, which will be described later on.

Also, as shown in FIGS. 2 and 4, the heat sink 1 is made into a flat form and is made of a highly heat-conductive material such as aluminum. One surface of the heat sink 1 serves as a heat-receiving face 1a, which is placed on the upper surface of the heating element A. On the other surface of the heat sink 1 opposite the heat receiving face 1a, a liquid channel 4 folded several times is grooved. The liquid channel 4 is sealed by a substrate D via a gasket 5. In FIG. 4, the substrate D is omitted and not shown. The substrate D is formed of a synthetic resin excelling in heat resistance or a similar material.

The ends of the liquid channel 4 are respectively communicated with a supply pore 7 and a return pore 8, each of which extends through a joint arm 6 projecting diagonally from the edge portion of the heat-receiving face 1a.

A cooling liquid flowing within the liquid channel 4, the metal pipes 20 and 21, and the pump portion 3 is preferably a liquid having a large specific heat, an example including but not restricted to water.

As shown in FIG. 2, the pump portion 3 has a housing 9 formed into a flat shape and is formed of a synthetic resin material excelling in heat resistance or the like, and a pump chamber 10, which has an opening at a lower surface of the housing 9, is provided within the housing 9. A gasket 11 is in contact with the periphery of the opening and a lid 12 for closing the opening are placed on the lower surface of the housing 9.

A screw 13 to extend through the lid 12 and the gasket 11 (see FIG. 1), is screwed into a screw hole (not shown) placed on the lower surface of the housing 9 to fit the lid 12 and the gasket 11 to the lower surface of the housing 9 to thereby seal the pump chamber 10. The lid 12 and the gasket 11 are made of a synthetic resin material excelling in heat resistance or a similar material.

A shaft 14 is fixed to a boss projecting outwardly from approximately the center of the inner surface of the lid 12 and, at the same time, a projection 15 is placed on the inner surface of the housing 9 at a position opposing to the shaft 14 (see FIG. 2).

An impeller 16 supported by the shaft 14 to be freely rotated and having an upper surface is brought into point to point contact with the projection 15 placed inside of the pump chamber 10. As shown in FIG. 1, with regard to the impeller 16, a plurality of blades 16a (four blades in this embodiment) extending towards the direction of normal lines are placed on the surface of a circular thin plate.

As shown in FIG. 1, into the pump chamber 10, an outlet 17 which discharges the cooling liquid and an inlet 19 into which the cooling liquid flows are placed. A concave portion 18 is formed on the inner wall of the pump chamber 10 from a portion in the vicinity of the inlet to the central portion of the impeller 16 such that the cooling liquid from the inlet 19 can arrive at the central portion of the impeller 16.

Consequently, when the impeller 16 rotates, the cooling liquid within the pump chamber 10 flows out of the outlet 17 into the metal pipe 20 at the supply side, which will be described later on. Also, the cooling liquid flows into the central portion of the impeller via the inlet 19 passing through the metal pipe 21 at the return side. This constitutes a so-called centrifugal pump.

The centrifugal pump, not only having a simple structure but also making it possible for the impeller 16 to be made into a small and thin shape.

Next, the metal pipe 20 at the supply side and the metal pipe 21 at the return side are shown in FIG. 5. Each of the metal pipe 20 at the supply side and the metal pipe 21 at the return side is formed by winding a pipe made of a highly heat conductive material such as a copper pipe, approximately halfway round the housing 9 and folding it, and both pipes are placed in contact with a mounting plate 23.

One end 20a of the metal pipe 20 at the supply side is fitted to the outlet 17, and the other end 20b is fitted to the supply port 7 formed in the heat sink 1. On the other hand, one end 21a of the metal pipe 21 at the return side is fitted to the inlet 19 and the other end 21b is fitted to the return port 8 formed in the heat sink 1.

Onto a portion of each of the metal pipe 20 at the supply side and the metal pipe 21 at the return side, a radiating fin 37 made of a thin copper band, which is a highly heat conductive material, being bent into a wave form, is fixed in such a manner that the temperature of the cooling water circulated within the pipes 20 and 21 is lowered.

The mounting plate 23 is provided on a support leg 22 projecting outwardly from the upper surface of the housing 9 toward the outside. The mounting plate 23 and the housing 9 are formed together with each other and integrally constructed. More specifically, the housing 9, the support leg 22, and the mounting plate 23 are formed integrally utilizing a synthetic resin excelling in heat resistance or a similar material.

The mounting plate 23 plays a role in mounting the pump portion 3 on the substrate D (see FIG. 2) and also plays a role in holding a fan 25, which will be described later on. The mounting plate 23 is in a plate form having the outline of a rectangle and, on the central portion thereof, an arc pore 24 is provided for introducing the air from within the body into the fan 25.

A concave portion 23a is formed along the arc port 24, and the metal pipe 20 at the supply side and the metal pipe 21 at the return side are mounted on the concave portion 23a. The metal pipes 20 and 21 and a part of the radiating fin 37 are mounted in contact with the surface of the concave portion 23a.

Since the metal pipe 20 at the supply side and the metal pipe 21 at the return side are directly mounted on the mounting plate 23 as described above, it is possible to transfer the heat to the side of the mounting plate 23. For this reason, it becomes possible to also have the mounting plate 23 serve as a cooling means.

As shown in FIG. 4, on the upper surface of the mounting plate 23, a circular projection 26, whose height is low and which guides the rotation of the fan 25, is placed.

The fan 25 is formed from a thin plate having a circular outline, has a rotating shaft placed at the center portion thereof, and has a plurality of slits provided on the periphery portions thereof. Exhaust blades 28 each having a helix angle are formed on the tongue like pieces which are formed between the slits. A magnet 29 for rotating the fan, which transmit a rotational force to the fan 25, is fixed onto the upper surface of the fan 25. The magnet 29 for rotating the fan is formed in a circular shape and is placed between the rotation shaft 27 and the exhaust blades 28.

As shown in FIG. 2, two bearings 31 which support the rotation shaft portion 30 which projects down from the inner surface of the substrate D, and the positions for inserting the bearings 31 are fixed by means of rings 32. The fan 25 and the impeller 16 are positioned such that the axis lines of the rotation shaft 27 and the rotation shaft 14 of the impeller 16 are on an identical line.

On the peripheral surface of the bearing portion 30 of the substrate D, a motor substrate 33 is placed, and screws to extend through bores 34 of the motor substrate 33 are screwed to the screw bores formed in the inner surface of the substrate D.

Onto the motor substrate 33, two coils 35 are fixed, and the lead lines 36 are connected to the coils 35.

When an alternative current is supplied to these lead lines 36 to change the magnetic field, the fan 25 is rotated by means of the magnet 29 for rotating the fan, and the air from within the body is introduced from the port 24 (see FIG. 2). The air thus introduced is discharged from the exhaust port 23b adjacent to the exhaust port of the body to carry out the exhaust.

Since the air existing within the body passes through the arc port 24 in the mounting plate 23 to be discharged out of the body as described above, the pup portion 3, the metal pipe 20 at the supply side, the metal pipe 21 at the return side, radiating fins 37 placed on the metal pipe 20 at the supply side and the metal pipe 21 at the return side are cooled by the air.

In this way, a forcible air cooling mechanism C is constructed which not only air cools the metal pipe 20 at the supply side and the metal pipe 21 at the return side via the radiating fins 37, but also air cools the housing 9 of the pump portion 3, as described above.

FIG. 3 is a cross-sectional view which illustrates the mechanism for rotating the impeller 16. In this figure, the mechanism for rotating the impeller 16 is constructed such that a passive magnet 39 for the impeller 16 is directly subjected to the magnetic force of the magnet 29 for rotating the fan 25 placed on the upper surface of the fan 25.

In this construction, when the fan 25 is rotated under the effect of the magnetic fluctuation of the coils 35 of the motor substrate 33, the magnet 29 for rotating the fan 25 which is placed on the fan 25 is also rotated.

In addition, the magnet 39 for the impeller 16, which has been subjected to the magnetic force of the magnet 29 for rotating the fan 25 is rotated following to the movement of the magnet 29 for rotating the fan 25. Since the passive magnet 39 is fixed on the impeller 16, the rotation of the passive magnet 39 rotates the impeller 16.

As described above, following to the rotation of the fan 25, the impeller 16 is also rotated around the projection 15 to actuate the pump portion 13.

As shown in FIG. 6, the rotation mechanism for rotating the impeller 16 of the pump portion 3 may also have a construction such that a magnet 38 for driving the impeller 16 is fixed on the lower surface of the fan 25, and the passive magnet 39 which is subjected to the magnetic force of the magnet 38 for driving the impeller 16 is embedded on the upper surface of the impeller 16.

By having such a construction, when the fan 25 is rotated under the effect of the magnetic fluctuation of the coils 35 of the motor substrate 33, the impeller 16 having the passive magnet 39, which is subjected to the magnetic force of the magnet 38 for driving the impeller placed on the fan 25 and the passive magnet 39 placed on the impeller 16, it is possible to construct a driving mechanism for driving the impeller 16.

Since the driving mechanism for driving the impeller 16 shown in FIG. 3 omits the magnet 38 for driving the impeller, only the two magnets are required to be used for the magnet 29 for driving the fan. This mechanism has a construction simpler than that of the driving mechanism for driving the impeller 16 shown in FIG. 6.

Furthermore, in any case of the driving mechanism for driving the impeller 16 shown in FIG. 3 or FIG. 6, since the motor substrate 33 composed of an insulating substrate in a plate form, the fan 25 formed in a thin plate and the pump portion 3 formed in a flat shape are laminated on each other such that the pump portion 3 of the liquid cooling mechanism B and the forcible air cooling mechanism C are downsized in a compact and thinner size.

Furthermore, since at least part of the heat-radiation fin 37, and metal pipes 20 and 21, surrounding the outside of the pump portion 3 is placed facing the port 24 such that it can directly come into contact with the discharging air from within the body (the air flow), thus providing the advantage of enhancing the cooling effect.

As shown in FIG. 2, the heating element A such as a semiconductor element is located within the electronic device. The heat sink 1 of the liquid cooling mechanism B is brought into contact with the upper surface of the heating element A over a wide area such that the heat generated from the heating element A is transmitted to the heat sink 1.

When an alternative current passes through the coil 35 of the motor substrate 33, the fan 25 is rotated and, at the same time, the impeller 16 of the pump portion 3 is rotated together with the fan 25.

By the rotation of the impeller 16, the cooling liquid supplied from the pump portion 3 passes through the metal pipe 20 at the supply side and through the liquid channel within the heat sink 1 (see FIG. 4). This allows the heat sink 1, whose temperature would have otherwise risen due to the receipt of the heat, to be cooled. The cooling liquid whose temperature rises as it absorbs the heat is continuously returned to the pump portion 3 via the metal pipe 21 at the return side.

In the conventional cooler, the heat absorbed by the cooling liquid is self-cooled mainly by being emitted into the atmosphere from the pump portion 3, the metal pipes 20 and 21, and the surface of the heat sink 3, but some part of the heat is accumulated in the cooling liquid thereby raising the temperature of the cooling liquid. Consequently, the conventional cooler is disadvantageous in that the cooling effect is gradually nullified. In contrast, according to the present invention, the temperature rise in the cooling liquid is suppressed by the forcible air cooling mechanism C which will be described here in below.

To be more specific, the forcible air cooling mechanism C is constructed by the radiating fin 37 fixed on the metal pipes 20 and 21, and the fan 25, and the air from within the body of the electronic device passes through the port 24 by the fan 25 and is then discharged.

At this time, the air is discharged out, while air-cooling the outer surface of the pump portion 3, the metal pipes 20 and 21, and the radiating fin 37.

The radiating fin 37 is formed of a thin bent plate strip, and do has an extremely large heat-transmitting area. Accordingly, the radiating fin 37 has a large cooling effect, and the metal pipes 20 and 21 on which the radiating fin 37 is fixed are kept at approximately atmospheric temperature, allowing the cooling liquid passing within the pipes 20 and 21 to be forcibly cooled.

The outer surface of the pump portion 3 is forcibly cooled by forcibly discharging the air from within the body, to remove the heat from the cooling liquid within the pump chamber 10 (see FIG. 2), but its cooling effect is not higher than that of the radiating fin 37.

Even if heat radiation from the heating element A of the electronic device continues over a prolonged period of time, the cooling liquid is always forcibly cooled by the air to maintain the cooling effect by virtue of the forcible air cooling mechanism C as described above with the result that the cooling efficiency of the cooler for an electronic device is very high and, what is more, the cooling efficiency is never nullified over a prolonged period of time. Furthermore, the pump is continuously actuated to continuously circulate the cooling liquid, making it possible to obtain an effective heat-radiation effect.

Whereas the radiating fin and the like are cooled by discharging the air from within the body 40 of the electronic device in the embodiment described above, it is also possible to cool the radiating fin and the like by introducing air from outside the body 40 of the electronic device. In the case where the housing 9, the mounting plate 23 and the like are made of synthetic resin excelling in heat resistance, the cooler can be designed to have a light weight, contributing to the manufacture of a light weight electronic device.

As described above, the present invention having a construction described above can provide a small and thin cooler for an electronic device, which can obtain an effective and sufficient cooling effect and without the fear of being damaged.

What is claimed is:

1. A cooler with a circulating cooling liquid for cooling a heating element of an electronic device comprising:
    a substrate;
    a liquid cooling mechanism, composed of:
    a flat-shape heat sink with a liquid channel therein having a heat-receiving face made in contact with said heating element,
    a pump portion with a flat-shape housing having an impeller rotatably provided therein to circulate said cooling liquid,
    a plurality of metal pipes connected to the liquid channel for circulating said cooling liquid;
    a forcible air cooling mechanism, composed of:
        a radiating fin provided on said metal pipes and
        a fan to cool said radiating fin and said flat-shape housing,
        wherein said pump portion and said fan are provided on the substrate so that said liquid cooling mechanism is integrated with said forcible air cooling mechanism.

2. The cooler for an electronic device as claimed in claim 1, wherein an axis of rotation of said impeller and an axis of rotation of said fan are co-linear.

3. The cooler for an electronic device as claimed in claim 1 or 2, wherein said fan and said impeller are rotated together as each is under an influence of a magnetic force.

4. The cooler for an electronic device as claimed in claim 3, wherein an active magnet asserting a magnetic force under an influence of a magnetic fluctuation of a motor substrate to rotate the fan is placed above said fan, while the passive magnet with a magnetic force influenced by said active magnet for driving the impeller, is placed on said impeller.

5. The cooler for an electronic device as claimed in claim 4, wherein said motor substrate is made of an insulating plate having a coil, said fan being in the form of a thin plate having a plurality of bent blades on a periphery of a thin plate having a rotation axis at a middle portion, and said motor substrate, said fan and said pump portion in a flat form being laminated on each other.

6. The cooler for an electronic device as claimed in claim 3, wherein an active magnet asserting a magnetic force under an influence of a magnetic fluctuation of the motor substrate to rotate the fan is placed above said fan, while a passive magnet with a magnetic force influenced by the magnetic force of said active magnet is placed above said impeller so as to allow said fan and said impeller to rotate together.

7. The cooler for an electronic device as claimed in claim 6, wherein said motor substrate is made of an insulating plate having a coil, said fan is in the form of a thin plate having a plurality of bent blades on a periphery of the thin plate having a rotation axis at a middle portion, and said motor substrate, said fan and said pump portion in a flat form are laminated on each other.

8. The cooler for an electronic device as claimed in claim 1, wherein the plurality of metal pipes each connecting the pump portion to the liquid channel of the heat sink are folded at least once between the pump portion and the heat sink, and said radiating fin is disposed between the folded metal pipes.

9. The cooler for an electronic device as claimed in claim 8, wherein said radiating fin and the portions of said plurality of metal pipes on which the radiating fin is placed are mounted on, and in contact with, a mounting plate having the housing provided thereon to form the pump portion.

10. The cooler for an electronic device as claimed in claim 9, wherein a port capable of allowing air passing through is formed on at least one portion of the mounting plate where the radiating fin is positioned.

11. The cooler for an electronic device as claimed in claim 1, wherein the heat sink is made of aluminum, and the metal pipe is made of copper.

* * * * *